United States Patent
Dunn et al.

(10) Patent No.: US 9,313,917 B2
(45) Date of Patent: *Apr. 12, 2016

(54) THERMAL PLATE WITH OPTIONAL COOLING LOOP IN ELECTRONIC DISPLAY

(71) Applicant: Manufacturing Resources International, Inc., Alpharetta, GA (US)

(72) Inventors: William Dunn, Alpharetta, GA (US); Don Le, Alpharetta, GA (US); Ware Bedell, Cummings, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 197 days.

This patent is subject to a terminal disclaimer.

(21) Appl. No.: 13/954,469

(22) Filed: Jul. 30, 2013

(65) Prior Publication Data

US 2014/0111942 A1    Apr. 24, 2014

Related U.S. Application Data

(63) Continuation of application No. 12/630,469, filed on Dec. 3, 2009, now Pat. No. 8,497,972, and a continuation-in-part of application No. 12/618,104, filed on Nov. 13, 2009, now Pat. No. 8,310,824.

(51) Int. Cl.
   *G02F 1/1333* (2006.01)
   *H05K 7/20* (2006.01)
   *F28F 3/00* (2006.01)

(52) U.S. Cl.
   CPC .............. *H05K 7/20154* (2013.01); *F28F 3/00* (2013.01); *G02F 1/133382* (2013.01); *H05K 7/20963* (2013.01); *G02F 1/133385* (2013.01); *G02F 2201/36* (2013.01)

(58) Field of Classification Search
   CPC ............ G02F 1/1333; G02F 1/133308; H01L 23/367; H01L 51/529
   USPC .......................................... 349/161
   See application file for complete search history.

(56) References Cited

U.S. PATENT DOCUMENTS 4,093,355 A    6/1978    Kaplit et al.
4,593,978 A    6/1986    Mourey et al.
(Continued)

FOREIGN PATENT DOCUMENTS

GB    2402205    1/2004
JP    03153212    7/1991
(Continued)

OTHER PUBLICATIONS

Zeef, Hubing, EMC analysis of 18' LCD Monitor, Aug. 2000, 1 page.

*Primary Examiner* — Huyen Ngo
(74) *Attorney, Agent, or Firm* — Standley Law Group LLP

(57) ABSTRACT

Disclosed is a thermal plate assembly and method for cooling an electronic display. The thermal plate may contain a first portion which is in thermal communication with the electronic display. A second portion of the thermal plate may be in thermal communication with the housing. Apertures may be placed within the plate and a fan may be positioned to draw air through the apertures. A gap may be located between the electronic display and a transparent plate assembly, where the fan may be further positioned to force air through the gap as well.

19 Claims, 5 Drawing Sheets

(56) References Cited

U.S. PATENT DOCUMENTS

| | | |
|---|---|---|
| 4,634,225 A | 1/1987 | Haim et al. |
| 5,029,982 A | 7/1991 | Nash |
| 5,088,806 A | 2/1992 | McCartney et al. |
| 5,247,374 A | 9/1993 | Terada |
| 5,559,614 A | 9/1996 | Urbish et al. |
| 5,748,269 A | 5/1998 | Harris et al. |
| 5,767,489 A | 6/1998 | Ferrier |
| 5,818,010 A | 10/1998 | McCann |
| 5,991,153 A | 11/1999 | Heady et al. |
| 6,089,751 A | 7/2000 | Conover et al. |
| 6,157,432 A | 12/2000 | Helbing |
| 6,191,839 B1 | 2/2001 | Briley |
| 6,417,900 B1 | 7/2002 | Shin et al. |
| 6,535,266 B1 | 3/2003 | Nemeth et al. |
| 6,628,355 B1 | 9/2003 | Takahara |
| 6,839,104 B2 | 1/2005 | Taniguchi et al. |
| 6,885,412 B2 | 4/2005 | Ohnishi et al. |
| 6,943,768 B2 | 9/2005 | Cavanaugh et al. |
| 7,284,874 B2 | 10/2007 | Jeong et al. |
| 8,241,573 B2 * | 8/2012 | Banerjee et al. ............ 422/82.05 |
| 8,678,603 B2 * | 3/2014 | Zhang ........................ 362/97.1 |
| 2002/0101553 A1 | 8/2002 | Enomoto et al. |
| 2002/0126248 A1 | 9/2002 | Yoshida |
| 2003/0007109 A1 | 1/2003 | Park |
| 2004/0035558 A1 * | 2/2004 | Todd et al. ............... 165/104.26 |
| 2004/0036834 A1 | 2/2004 | Ohnishi et al. |
| 2004/0165139 A1 | 8/2004 | Anderson et al. |
| 2005/0213950 A1 | 9/2005 | Yoshimura |
| 2006/0082271 A1 | 4/2006 | Lee et al. |
| 2006/0132699 A1 | 6/2006 | Cho et al. |
| 2006/0199514 A1 | 9/2006 | Kimura |
| 2006/0209266 A1 | 9/2006 | Utsunomiya |
| 2007/0140671 A1 | 6/2007 | Yoshimura |
| 2007/0151664 A1 | 7/2007 | Shin |

FOREIGN PATENT DOCUMENTS

| | | |
|---|---|---|
| JP | 6082745 A | 3/1994 |
| JP | 08194437 | 7/1996 |
| JP | 8339034 | 12/1996 |
| JP | 11160727 | 6/1999 |
| JP | 2002158475 | 5/2002 |
| JP | 2004004581 A | 1/2004 |
| JP | 2004205599 A | 7/2004 |
| JP | 2005017556 A | 1/2005 |
| JP | 2005134849 | 5/2005 |
| KR | 20040097466 A | 11/2004 |
| KR | 1020070070675 | 7/2007 |
| WO | WO2005079129 | 8/2005 |

* cited by examiner

THERMAL PLATE WITH OPTIONAL COOLING LOOP IN ELECTRONIC DISPLAY

CROSS-REFERENCE TO RELATED APPLICATIONS

This application is a continuation of U.S. application Ser. No. 12/630,469, now U.S. Pat. No. 8,497,972, which is hereby incorporated by reference as if fully recited herein. Application Ser. No. 12/630,469 is a continuation in part of U.S. application Ser. No. 12/618,104, now U.S. Pat. No. 8,310,824, filed Nov. 13, 2009, which is hereby incorporated by reference as if fully recited herein.

FIELD OF THE INVENTIVE CONCEPT

The exemplary embodiments herein are directed towards an electronic display having a thermal plate with an optional cooling loop for conductive and convective cooling.

BACKGROUND OF THE INVENTIVE FIELD

Electronic displays are now being used for not only indoor entertainment purposes, but are now being utilized for indoor and outdoor advertising/informational purposes. For example, liquid crystal displays (LCDs), plasma displays, light emitting diode (LED), electroluminescence, light-emitting polymers, organic light emitting diode displays (OLEDs) and many other displays can now be used to display information and advertising materials to consumers in locations outside of their own home or within airports, arenas, transit stations, stadiums, restaurants/bars, gas station pumps, billboards, and even moving displays on the tops of automobiles or on the sides of trucks.

The rapid development of these displays has allowed users to mount them in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays.

When used outdoors, high ambient temperatures and solar loading can present several thermal-regulatory issues. When a display is exposed to direct sunlight this can increase the temperature of the display dramatically due to the solar loading of the front display surface due to the radiative heat of the sun. It has been found, that moving air through a gap between the exterior transparent plate and the image assembly can sometimes provide adequate cooling of the display assembly. Further, when producing an image with a display that has been placed in direct sunlight, the illumination of the display assembly must overcome the high ambient light levels. Thus, the display must be very bright and sometimes produce high levels of illumination which can generate high levels of heat coming from the image assembly (or backlight if necessary). This heat must be removed from the display or it may damage the electrical assemblies. If an LCD is used, high internal temperatures can cause the liquid crystal material to malfunction and may produce noticeable failures on the image. LEDs can degrade in performance and efficiency when exposed to high temperatures. Other technologies (OLED, light-emitting polymers, etc.) can also malfunction when exposed to high temperatures.

SUMMARY OF THE EXEMPLARY EMBODIMENTS

An exemplary embodiment may contain a thermal plate which can transfer heat from the image assembly to the housing of the display and into the ambient air through convection. A transparent plate assembly may be used which can provide the front surface for a narrow channel of cooling air which may be directed between the transparent plate assembly and the image assembly. The cooling air can also pass over the thermal plate in order to aid in cooling the thermal plate. In some embodiments, the thermal plate may run the entire length of the image assembly and may contain several apertures which allow cooling air to pass through the plate. When using an LCD display with an LED backlight, the heat generated by the LED backlight can also be transferred through the thermal plate and into the display housing as well as the cooling air. The display housing can be sealed and does not require an inlet of ambient air so that the display can be used in environments which have contaminates (dust, grease, pollen, dirt, leaves, garbage, water, insects, smoke, salt, fumes, etc.) present within the ambient air.

The exemplary embodiments herein are not intended to be exhaustive or to unnecessarily limit the scope of the invention. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
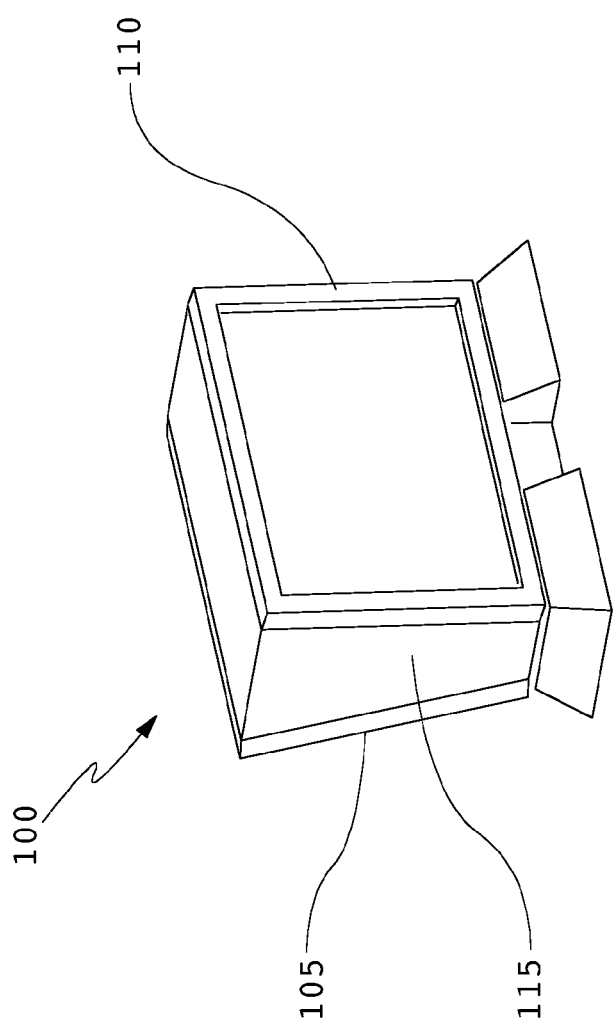
FIG. 1 provides a perspective view of an embodiment which uses two displays in a back-to-back arrangement.

FIG. 1 provides a perspective view of one embodiment which uses a dual-display assembly 100. In a preferred embodiment, the housing 115 and the door frames 105 and 110 would provide an environmentally-sealed enclosure to protect the internal components of the display assembly 100 from damage due to dust, grease, pollen, dirt, leaves, garbage, water, insects, smoke, salt, fumes, etc. Although shown with two displays back-to-back, this setup is not required. A single display assembly can be used as well. The exemplary embodiments herein are capable of cooling the display without having to ingest ambient air (although this can be used if desired).

Figure 2:
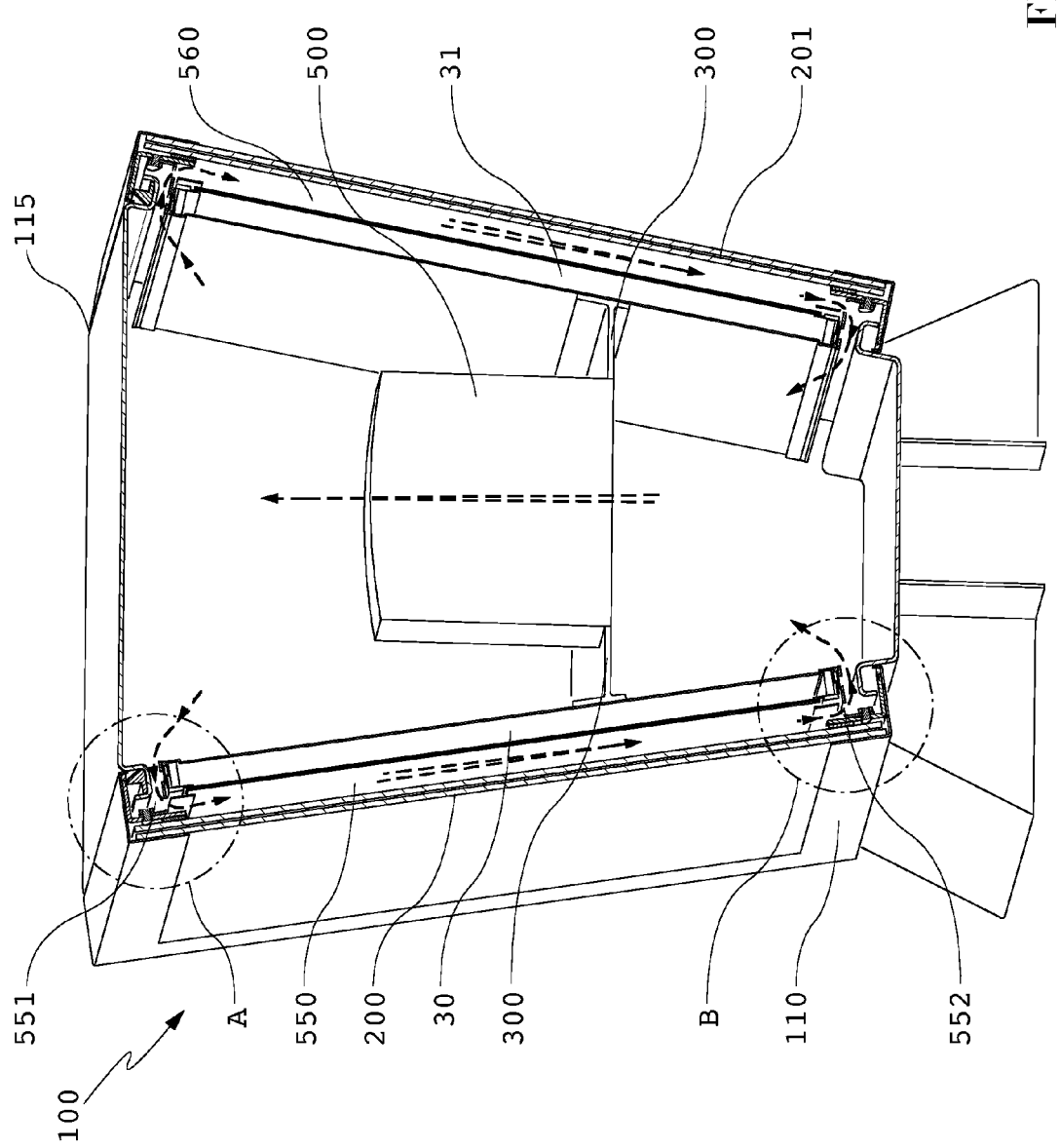
FIG. 2 provides a perspective sectional view of the embodiment shown in FIG. 1 and showing the air flow through the housing.

FIG. 2 provides a sectional view of the embodiment shown in FIG. 1. This figure illustrates the air flow (dashed lines) through the housing 115. A transparent plate assembly 200 may be placed in front of the image assembly 30. For this embodiment, the transparent plate assembly 200 may be contained within the door frame 110 which is then attached to the housing 115. However, in other embodiments the door frame would not be a separate piece but would simply be provided by the housing. In these embodiments, the housing 115 would extend around the transparent plate assembly 200 without the need for a separate door frame 110.

The image assembly 30 will vary depending on the type of display being used with the particular embodiment. For example, if an LCD display is being used the image assembly 30 will typically comprise several layers including: a backlight, front and rear polarizers, liquid crystal material sandwiched between two transparent plates, an electrically-conductive layer, and possibly additional polarizing/anti-reflective layers. An OLED display on the other hand, may comprise: a cathode, emissive layer, conductive layer, and an anode. As mentioned above, embodiments can be practiced with any type of flat panel display, including but not limited to: LCD, OLED, plasma, light emitting polymer (LEP) and organic electro luminescence (OEL) displays.

The transparent plate assembly 200 can be made of a variety of materials and may have one or more layers. Various transparent glasses, plastics, or composite materials may be used to produce the transparent plate assembly 200. However, in an exemplary embodiment the transparent plate assembly 200 would be made of glass and even more preferably would be made of two or more plates of glass which are laminated together with index-matching optical adhesive. Further, an exemplary embodiment would also contain a polarizer on the transparent plate assembly 200. Preferably, the polarizer would be placed on the inside surface of the glass assembly and would also contain an anti-reflective (AR) layer. It has been found that adding the polarizer layer on the transparent plate assembly 200 can reduce reflections and also reduce the solar loading on the image assembly 30.

A channel 550 may be defined by the rear surface of the transparent plate assembly 200 and the front surface of the image assembly 30. The channel 550 has an inlet opening 551 and exit opening 552. In the dual-display embodiment, the display assembly 100 is mostly symmetrical, having a second channel 560, second image assembly 31, and second transparent plate assembly 201 on the opposing side of the dual-display assembly 100.

A fan 500 may be used to draw air through the channels 560 and 550 and circulate it though the housing 115. While being circulated through the housing 115, the air may transfer heat to the interior walls of the housing 115 where it can then be transferred from the housing 115 to the ambient air. In an exemplary embodiment, the fan 500 may be mounted on a separating plate 300 which divides the interior cavity of the housing 115 into upper and lower portions. It has been found that this type of setup may provide an area of high pressure in one portion and low pressure in the other portion which can further drive the movement of air throughout the cavity. For example, in an exemplary embodiment the separating plate 300 may be used to create an area of high pressure in the top portion (near the inlet opening 551 of the channel 550) and an area of low pressure in the bottom portion (near the exit opening 552 of the channel 550) which may drive the air to flow through the channel 550 and return to the fan 500.

It has been found that solar loading of the front surface of the image assembly 31 and 30 can occur when the display assembly 100 is used in direct sunlight. This solar loading can result in a heat buildup on the front surface of the image assembly 30 and 31. By using the channels 560 and 550, this heat can be removed from the image assemblies and transferred to the display housing 115 (and optionally the door frame 110) where it can be transferred to the ambient air through convection.

Thus, in an exemplary embodiment, the thermal conductivity of the display housing 115 and door frame 110 would be high. Thus, metals are an exemplary material for constructing the display housing 115 and door frame 110. Preferably, there would be a low level of thermal resistivity between the inner and outer surfaces of the housing 115 and door frame 110 so that heat can be effectively transferred to the surrounding ambient air. Thermoelectric modules (not shown) may also be used in order to cool the interior of the display housing 115. Fins or heat sinks (not shown) may also be placed on the interior or exterior of the housing 115 and/or door frame 110 to increase the ability to absorb heat from the interior of the display and transfer it to the ambient surroundings.

Figure 3:
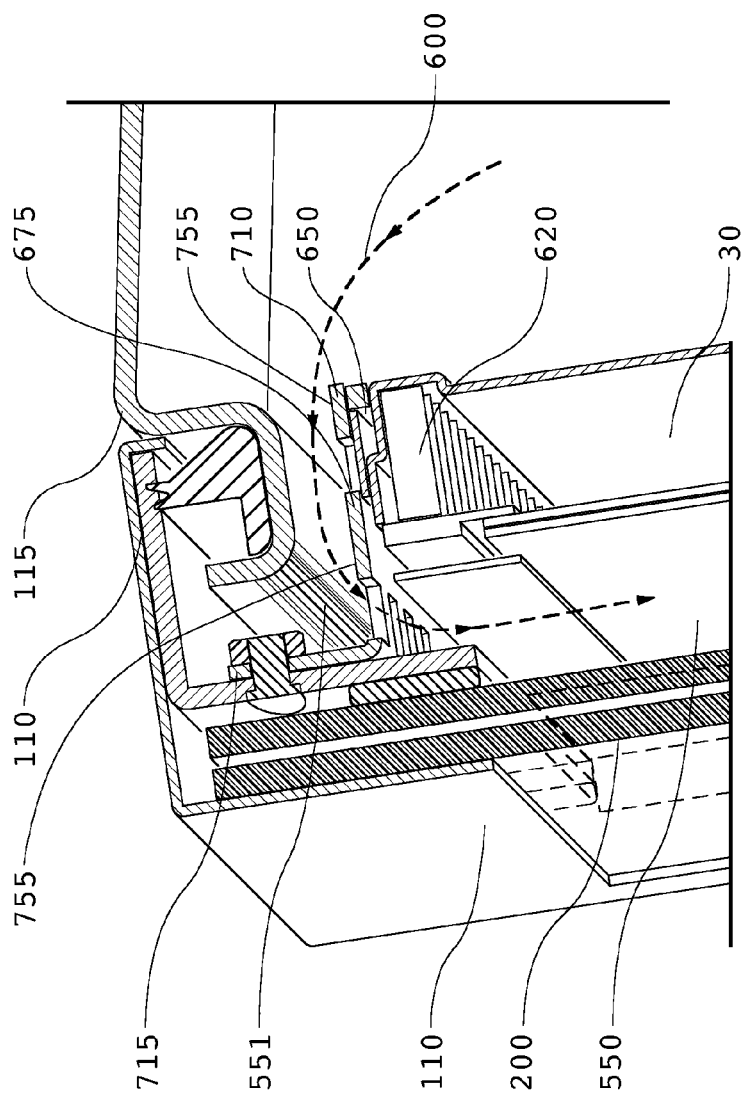
FIG. 3 provides a detailed view of insert A from FIG. 2.

FIG. 3 provides a detailed view of insert A from FIG. 2. In this embodiment, an LED edge-lit LCD is used as the image assembly 30. An array of LEDs 620 are provided along the edge of the LCD in order to provide a source of illumination. When used in outdoor environments, the illumination of the image assembly 30 must compete with the ambient light levels and sometimes with direct sunlight. In order to remain visible (and preferably very bright and clear), the illumination coming from the image assembly 30 must of course be brighter than the surroundings. Thus, when using an LED backlit LCD, the LEDs 620 must produce a high level of luminance which can sometimes cause the LEDs 620 to generate a substantial amount of heat.

The various optical properties of the light which is output from an LED are typically dependant upon temperature. Thus, as the temperature of the LED array 620 varies, the optical properties of the light may vary as well. These variations are undesirable because they may alter the image (color saturation, color temperature, brightness, contrast, etc.) that is being produced by the image assembly 30. Therefore, in an exemplary embodiment the heat that is produced by the image assembly 30 (in this case an edge-lit LED LCD) may be removed to maintain the image assembly 30 at a consistent temperature. This helps to ensure image accuracy as well as avoids damage or a shortened lifetime due to high temperatures.

Although described here in relation to an LED edge-lit LCD, it should be noted that these thermal effects are also observed when using other types of image assemblies, including but not limited to: plasma displays, direct backlit LCDs, light emitting diode (LED) displays, electroluminescence, light-emitting polymers, and organic light emitting diode displays (OLEDs). Thus, embodiments can be designed which would remove heat from these image assemblies as well.

In the embodiment shown in FIG. 3, the LED array 620 is placed in thermal communication with the door frame 110 and optionally the housing 115 as well. Once the heat has been transferred to the door frame 110 (and optionally the housing 115) it may be transferred to the ambient surroundings through convection. In an exemplary embodiment, a thermal plate 675 may be used to place the LED array 620 in thermal communication with the door frame 110 (and optionally the housing 115). An exemplary thermal plate 675 would have an 'L-shaped' cross-section containing a first and second portion. The first portion would have a distal end 710 and the second portion would have a distal end 715 where the two portions are joined at their proximal ends 712 (see FIGS. 4 and 5) in order to form the 'L' shape. (See FIG. 5 for more information on an exemplary thermal plate).

For the embodiment shown in FIG. 3, heat from the LED array 620 is transferred to the distal end 710 of the first portion of the thermal plate 675 where it may be transferred by conduction to the distal end 715 of the second portion. Once the heat has been transferred to the distal end 715 of the second portion then it may be transferred to the door frame 110. In an exemplary embodiment, the door frame 110 would also be in thermal communication with the housing 115 so that heat can also be transferred (preferably by conduction) to the housing 115 and further dissipate to the surroundings. As discussed above, in other embodiments the door frame 110 would not be a separate piece but would simply be provided by the housing 115. In these embodiments, the housing 115 would extend around the transparent plate assembly 200 without the need for a separate door frame 110. Thus, with these embodiments the thermal plate 675 would simply be in thermal communication with the housing 115.

An exemplary thermal plate 675 would also be placed in the path of cooling air 600, which aids in the transfer of heat from the LED array 620. As the heat moves from the distal end 710 of the first portion to the distal end 715 of the second portion, a plurality of apertures (see FIG. 5) may be located on the thermal plate 675 to allow the cooling air 600 to pass through the thermal plate 675 and traverse through channel 550. Optionally, the cooling air 600 can also pass over the surfaces of the thermal plate which oppose the LED array (see element 755 of FIG. 5). The cooling air 600 may be used to cause convective heat transfer from the thermal plate 675. A heat sink 650 may be used to place the LED array 620 and the thermal plate 675 in thermal communication with one another.

Specifically, when used with edge-lit LCDs, the exemplary embodiments have been found to be very effective in removing heat from the backlight. Edge-lit backlights concentrate a large amount of the heat along the edges of the image assembly 30. Because most of the heat is concentrated along the edges, it can be effectively removed by an exemplary thermal plate 675.

Figure 4:
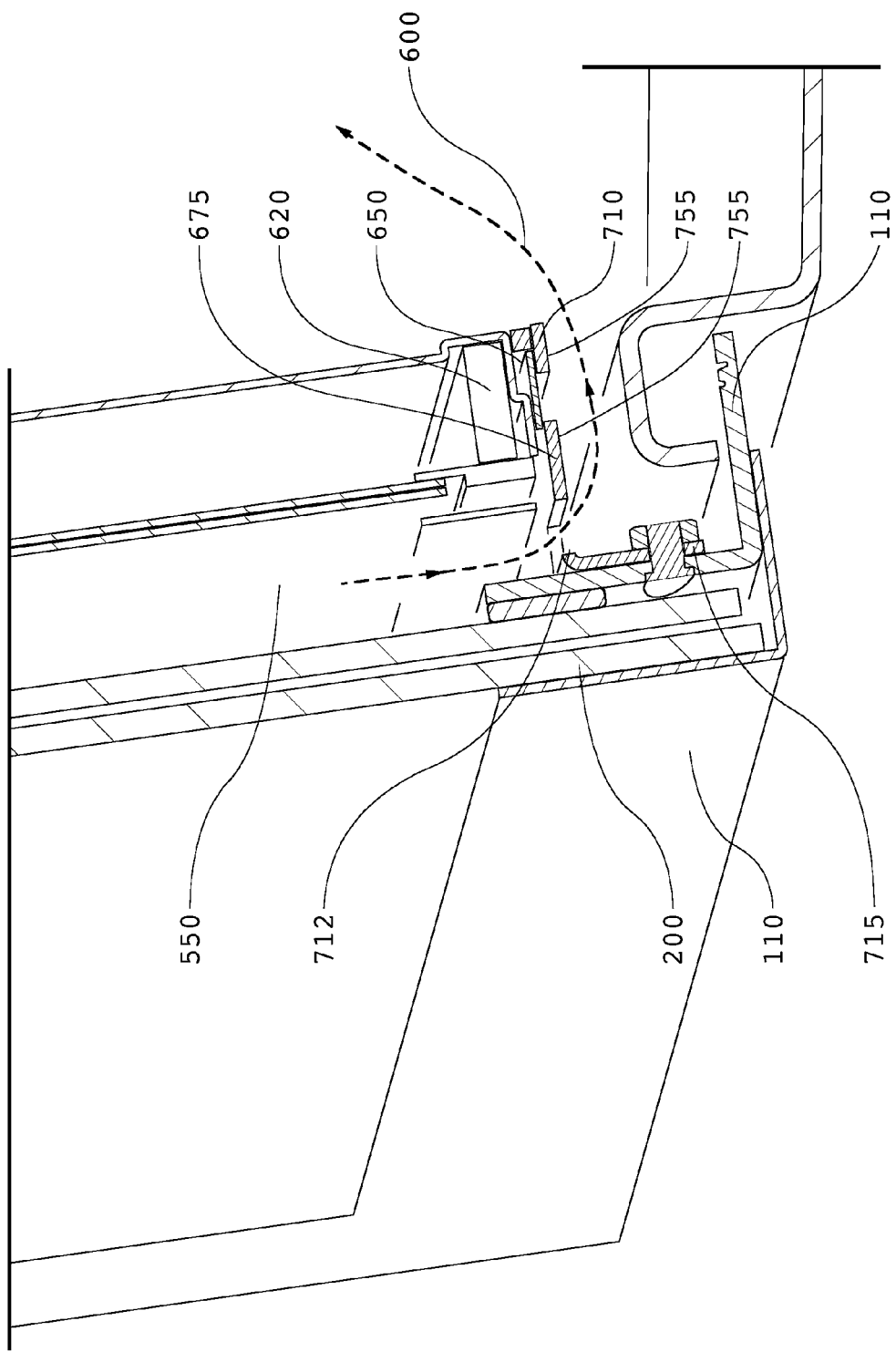
FIG. 4 provides a detailed view of insert B from FIG. 2.

FIG. 4 provides a detailed view of insert B from FIG. 2. Here, a similar configuration as shown in FIG. 3 may be used. For this embodiment, the LED array 620 may be placed in thermal communication with the door frame 110 and optionally the housing 115 as well. Once the heat has been transferred to the door frame 110 (and optionally the housing 115) it may be transferred to the ambient surroundings through convection. In an exemplary embodiment, a thermal plate 675 may be used to place the LED array 620 in thermal communication with the door frame 110 (and optionally the housing 115).

For the embodiment shown in FIG. 4, heat from the LED array 620 is transferred to the distal end 710 of the first portion of the thermal plate 675 where it may be transferred by conduction to the distal end 715 of the second portion. Once the heat has been transferred to the distal end 715 of the second portion then it may be transferred to the door frame 110 where it can then be transferred to the ambient surroundings. In an exemplary embodiment, the door frame 110 would also be in thermal communication with the housing 115 so that heat can also be transferred (preferably by conduction) to the housing 115 and further dissipate to the surroundings. As discussed above, in other embodiments the door frame 110 would not be a separate piece but would simply be provided by the housing 115. In these embodiments, the housing 115 would extend around the transparent plate assembly 200 without the need for a separate door frame 110. Thus, with these embodiments the thermal plate 675 would simply be in thermal communication with the housing 115.

An exemplary thermal plate 675 would also be placed in the path of cooling air 600, which aids in the transfer of heat from the LED array 620 (or image assembly 30—if an edge-lit LCD is not being used). As the heat moves from the distal end 710 of the first portion to the distal end 715 of the second portion, a plurality of apertures (see FIG. 5) may be located on the thermal plate 675 to allow the cooling air 600 to pass through the thermal plate 675 and traverse through channel 550. Optionally, the cooling air 600 can also pass over the surfaces of the thermal plate which oppose the LED array (see element 755 of FIG. 5). The cooling air 600 may be used to cause convective heat transfer from the thermal plate 675. A heat sink 650 may be used to place the LED array 620 and the thermal plate 675 in thermal communication with one another.

Figure 5:
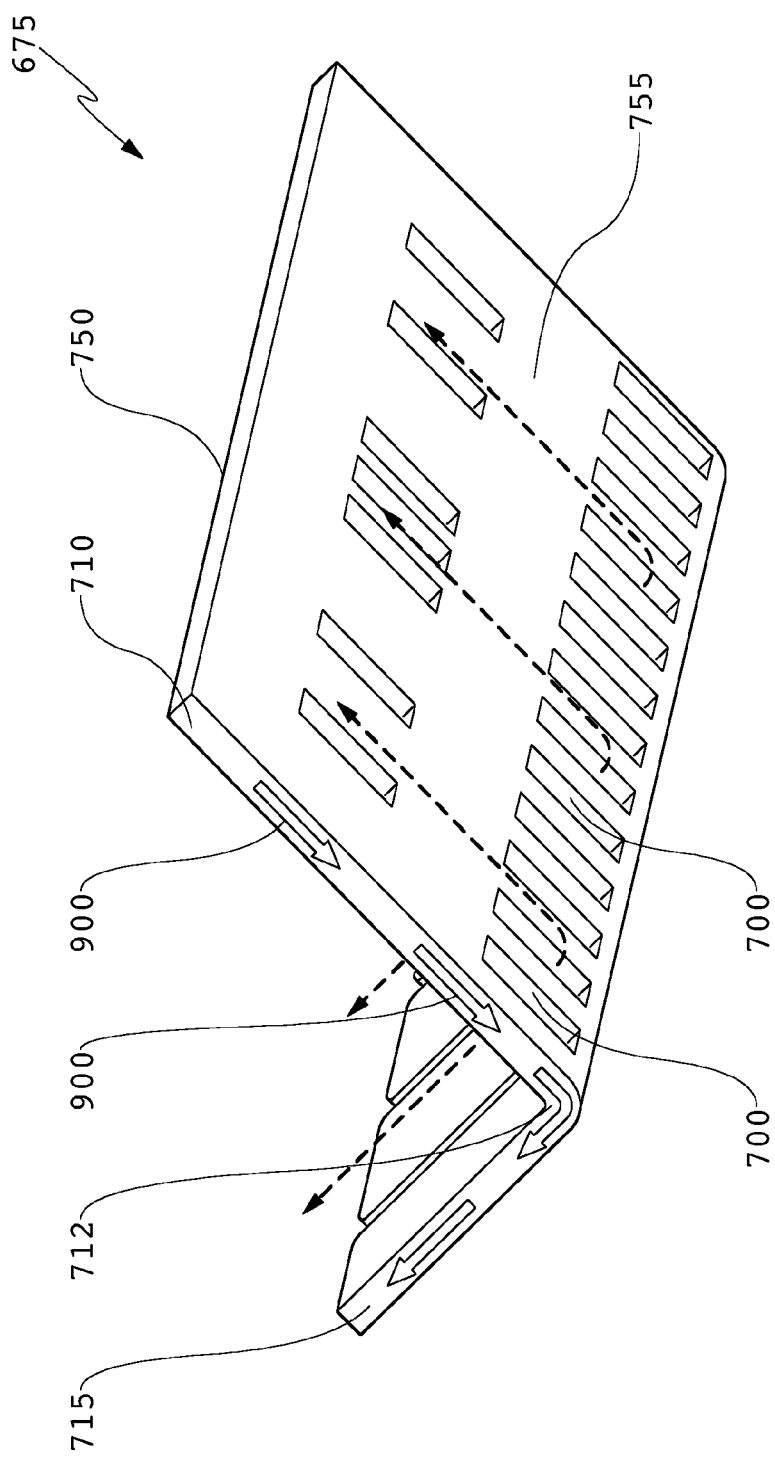
FIG. 5 provides a perspective view of one embodiment for an exemplary thermal plate.

FIG. 5 provides a perspective view of an exemplary embodiment for a thermal plate 675. As discussed above, an exemplary thermal plate 675 would have an 'L-shaped' cross-section containing a first and second portion. The first portion would have a distal end 710 and the second portion would have a distal end 715 where the two portions are joined at their proximal ends 712 in order to form the 'L' shape.

The LED array (or any other heat-producing portion of an image assembly 30) may be in thermal communication with surface 750 of the thermal plate 675. This heat may be transferred to the opposing side of the thermal plate 755 where cooling air (dashed lines) may pass over the surface 750 in order to remove the heat by convection. The remaining heat (indicated by the arrows 900) can also travel towards the proximal end 712 of the first portion where a plurality of apertures 700 allow the cooling air (dashed lines) to pass through the thermal plate 675 and further extract heat. Any heat that is still remaining (indicated by the arrows 900) continues to travel along the thermal plate 675 towards the distal end 715 of the second portion which is preferably in thermal communication with the door frame 110 (or the housing 115 or both the housing 115 and the door frame 110). The remaining heat is then transferred to the various portions of the door frame 110 and optionally the housing 115 so that it can be removed by convection into the surrounding ambient air.

Some embodiments may not utilize the apertures 700 in the thermal plate 675. Alternatively, these designs may use a plurality of smaller thermal plates 675 (those which do not run the entire length of the image assembly) and allow spacing in between these smaller plates for the cooling air to pass through.

The door frames 110 and 105, thermal plate(s) 675, and housing 115 would preferably be made out of a thermally conductive material and preferably with a low thermal resistance. An exemplary material may be metal, and preferably formed sheet metal, but could also be cast and/or machined or injection molded. Any thermally-conductive materials can be used.

Again, while some embodiments have been described herein with reference to back-to-back displays, the various teachings can be used with single display setups as well. In an exemplary embodiment, the thermal plate and cooling loop arrangement can be used in combination with a single display setup. Alternatively, the thermal plate could be used with or without the cooling air loop, in a single or dual display setup.

Exemplary embodiments provide display assemblies which may be mounted in areas which are subject to high ambient temperatures and even direct sunlight and will be able to dissipate the solar load as well as the heat produced by the image assembly and/or backlight (if necessary). The exemplary embodiments herein are capable of cooling the display without having to ingest ambient air (although this can be used if desired) which can be especially useful in environments which contain contaminates in the ambient air.

While certain embodiments are described in detail above, the scope of the invention is not to be considered limited by such disclosure, and modifications are possible without departing from the spirit of the invention as evidenced by the following claims.

What is claimed is:

1. A thermal plate for use with an electronic display placed within a thermally-conductive housing, the thermal plate comprising:
   a first portion which is in conductive thermal communication with the electronic display; and
   a second portion extending from the first portion and placed within conductive thermal communication with the housing.

2. The thermal plate of claim 1 wherein:
   the first and second portions form an 'L' shape.

3. The thermal plate of claim 1 wherein:
   the first portion of the thermal plate is in conductive thermal communication with a backlight assembly of the electronic display.

4. The thermal plate of claim 1 further comprising:
   a plurality of apertures within the first portion which permit air to flow through the thermal plate.

5. The thermal plate of claim 4 wherein:
   the apertures are slots.

6. The thermal plate of claim 5 wherein:
   the slots are oriented parallel to the path of the air.

7. The thermal plate of claim 1 wherein:
   the first and second portions are comprised of metal.

8. The thermal plate of claim 1 wherein:
   the plate is positioned along an edge of the electronic display.

9. The thermal plate of claim 1 wherein:
   the first portion of the thermal plate is in conductive thermal communication with an edge-lit LED backlight assembly of the electronic display.

10. A method for using a thermal plate to cool an electronic display within a thermally-conductive housing and having a transparent plate assembly positioned in front of the electronic display, the method comprising:
    presenting a thermal plate comprising a first portion which is in conductive thermal communication with the electronic display, and a second portion extending from the first portion and placed within conductive thermal communication with the housing;
    allowing heat to transfer from the electronic display to the first portion;
    allowing heat to transfer from the first portion to the second portion; and
    allowing heat to transfer from the second portion to the housing.

11. The thermal plate cooling method of claim 10 further comprising the steps of:
    presenting a plurality of apertures within the thermal plate; and
    forcing air through the apertures.

12. The thermal plate cooling method of claim 10 further comprising the steps of:
    presenting a fan which draws air across the thermal plate and between the electronic display and the transparent plate assembly.

13. The thermal plate cooling method of claim 10 further comprising the steps of:
    forcing air across the thermal plate and between the electronic display and the transparent plate assembly.

14. The thermal plate cooling method of claim 10 further comprising the steps of:
    presenting a plurality of apertures within the thermal plate; and
    forcing air through the apertures and between the electronic display and the transparent plate assembly.

15. A thermal plate assembly for use with first and second electronic displays placed back-to-back and within a thermally-conductive housing, each electronic display having an edge-lit backlight and a gap defined by the space between the electronic display and a transparent plate assembly, the thermal plate assembly comprising:
    a first thermal plate placed in conductive thermal communication with the edge-lit backlight of the first display;
    a second thermal plate placed in conductive thermal communication with the edge-lit backlight of the second display; and
    a fan positioned to circulate air across the first and second thermal plates as well as through the gap for the first display and the gap for the second display.

16. The thermal plate assembly of claim 15 further comprising:
    a plurality of apertures within the first and second thermal plates.

17. The thermal plate assembly of claim 16 wherein:
    the fan is further position to draw air through the apertures of the first and second thermal plates.

18. The thermal plate assembly of claim 15 wherein:
    the first thermal plate is further placed in conductive thermal communication with the housing; and
    the second thermal plate is further placed in conductive thermal communication with the housing.

19. The thermal plate assembly of claim 15 further comprising:
    a separating plate within the housing which divides the housing into lower and upper portions,
    wherein the fan is positioned on the separating plate.

* * * * *